(12) United States Patent
Liang et al.

(10) Patent No.: US 8,468,486 B2
(45) Date of Patent: Jun. 18, 2013

(54) ELECTRONIC DEVICE AND METHOD OF AUTOMATICALLY TESTING TRANSMISSION LINES

(75) Inventors: Hsien-Chuan Liang, New Taipei (TW);
Shen-Chun Li, New Taipei (TW);
Shin-Ting Yen, New Taipei (TW);
Chun-Neng Liao, New Taipei (TW);
Shou-Kuo Hsu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/326,652

(22) Filed: Dec. 15, 2011

(65) Prior Publication Data

US 2012/0221989 A1      Aug. 30, 2012

(30) Foreign Application Priority Data

Feb. 24, 2011   (TW) .............................. 100106181 A

(51) Int. Cl.
*G06F 17/50*      (2006.01)

(52) U.S. Cl.
USPC .......................................................... 716/126

(58) Field of Classification Search
USPC .................................................... 716/100, 126
See application file for complete search history.

(56) References Cited

U.S. PATENT DOCUMENTS

| 6,499,134 B1* | 12/2002 | Buffet et al. | 716/113 |
| 7,472,367 B1* | 12/2008 | Xie et al. | 716/132 |
| 2002/0120913 A1* | 8/2002 | Suzuki et al. | 716/13 |

* cited by examiner

*Primary Examiner* — Suchin Parihar
(74) *Attorney, Agent, or Firm* — Altis Law Group, Inc.

(57) ABSTRACT

An electronic device and method of automatically testing the transmission lines of a PCB. Design requirements of transmission lines are predetermined and a wiring diagram is acquired according to a designated wiring diagram storage path. Some basic parameters of each transmission line of the diagram are applied in excluding one or more transmission lines which may not meet the design requirements, then, the excluded transmission lines are marked and/or highlighted. A report of the transmission lines is generated using a report template.

9 Claims, 3 Drawing Sheets

Transmission line testing system
10

Design requirement predetermination module
100

Storage path designation module
101

Wiring diagram acquiring module
102

Transmission line testing module
103

Highlight module
104

Report template acquiring module
105

Report generation module
106

FIG. 2

ELECTRONIC DEVICE AND METHOD OF AUTOMATICALLY TESTING TRANSMISSION LINES

BACKGROUND

1. Technical Field

Embodiments of the present disclosure relate to devices and methods for testing printed circuit boards (PCBs), and more particularly to an electronic device and a method of automatically testing transmission lines that do not meet predetermined design requirements from a wiring diagram of a PCB.

2. Description of Related Art

PCBs are used in electronic devices. In the construction of an electronic device, a PCB is a place to mount electronic components and further provides a means of electrical connections between the electronic components. Transmission lines are used as one means to transmit electrical signals between the electronic components.

In transmissions via these transmission lines, the electrical signals may be weakened due to the poor quality or defects in the transmission lines. Thus, for achieving a better quality electrical signal, these transmission lines of the PCB need to be tested to exclude those that do not meet design requirements. Originally, the testing of the transmission lines was done by an engineer manually, this was troublesome and lengthy in terms of time.

BRIEF DESCRIPTION OF THE DRAWINGS

FIG. 2 is a block diagram of one embodiment of function modules of the transmission line testing system of FIG. 1.

DETAILED DESCRIPTION

Figure 1:
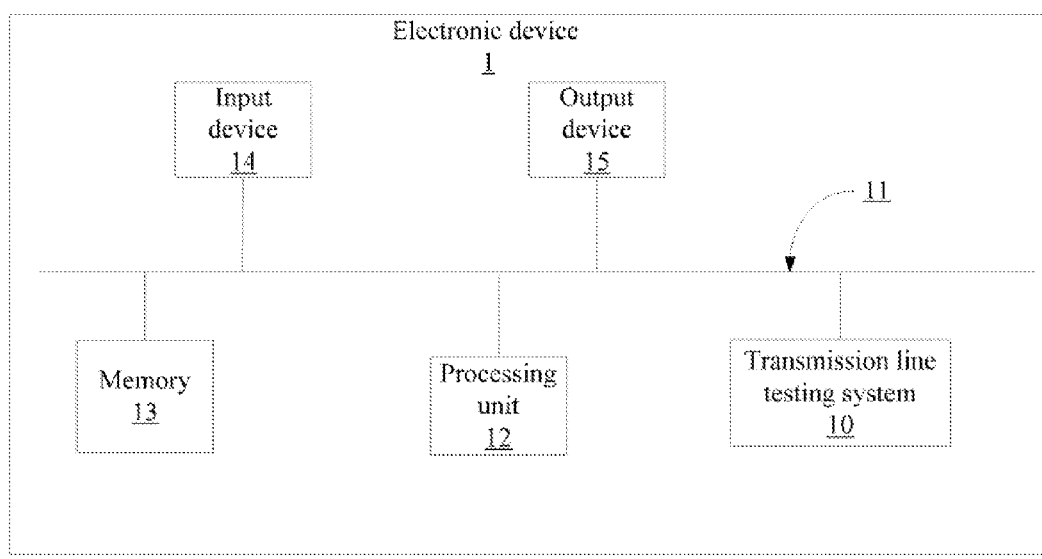
FIG. 1 is a block diagram of one embodiment of an electronic device including a transmission line testing system.

FIG. 1 is a block diagram of one embodiment of an electronic device 1 including a transmission line testing system 10. The electronic device 1 may further include components such as a bus 11, a processing unit 12, a memory 13, an input device 14, and an output device 15. One skilled in the art would recognize that the electronic device 1 may be configured in a number of other ways and may include other or different components.

The transmission line testing system 10 includes a number of function modules (depicted in FIG. 2). The function modules may include computerized code in the form of one or more programs, which have functions of automatically excluding transmission lines that do not meet predetermined design requirements, from a wiring diagram of a PCB.

The bus 11 permits communication among the components, such as the processing unit 12, the memory 13, the input device 14, and the output device 15.

The processing unit 12 may include a processor, a microprocessor, an application-specific integrated circuit (ASIC), and a field programmable gate array, (FPGA) for example. The processing unit 12 may execute the computerized code of the function modules of the transmission line testing system 10 to realize the functions of the transmission line testing system 10.

The memory 13 may include a random access memory (RAM) or other type of dynamic storage device, a read only memory (ROM) or other type of static storage device, a flash memory, such as an electrically erasable programmable read only memory (EEPROM) device, and/or some other type(s) of computer-readable storage medium, such as a hard disk drive, a compact disc, a digital video disc, or a tape drive. The memory 13 stores the computerized code of the function modules of the transmission line testing system 10 for execution by the processing unit 12

The memory 13 also stores one or more wiring diagrams of PCBs. A wiring diagram is an electronic file of a simplified conventional pictorial representation of an electrical circuit, in which multiple electrical components are wired together using transmission lines. The memory 13 further stores basic parameters of each of the transmission lines in the wiring diagram. In one embodiment, the basic parameters include, but are not limited to, signal reference parameters, wiring/crosstalk parameters, decoupling parameters, and placement parameters. The signal reference parameters may include a critical net crossing split reference plane, a critical net changing reference plan, and a critical net near edge reference plane. The wiring/crosstalk parameters may include a critical net near I/O net, the lengths of exposed critical lines, a critical net isolation of single-ended nets, a critical net isolation of differential nets, a critical differential net length matching and spacing, and wide power/ground lines. The decoupling parameters may include a decoupling capacitor density, a decoupling capacitor distance from an IC power pin, an IC power/ground-reference pin distance to via, a decoupling capacitor distance to via, and a power/ground-reference line decoupling. The placement parameters may include an I/O filter distance to I/O connector, and a distance from oscillator to clock driver.

In addition, the memory 13 stores one or more report templates, each of which is used to generate a test report after testing the transmission lines from a wiring diagram.

The input device 14 may include a mechanism that permits a user to input data to the electronic device 1, such as a microphone, a keyboard, a keypad, a mouse, a pen, voice recognition and/or biometric mechanisms, for example. The output device 15 may include one or more mechanisms that output data to the user, including a display, a printer, one or more speakers, for example.

FIG. 2 is a block diagram of one embodiment of the function modules of the transmission line testing system 10. In one embodiment, the transmission line testing system 10 may include a design requirement predetermination module 100, a storage path designation module 101, a wiring diagram acquiring module 102, a transmission line testing module 103, a highlight module 104, a report template acquiring module 105, and a report generation module 106. The function modules 100-106 provide the functions following (and illustrated in FIG. 3).

Figure 3:
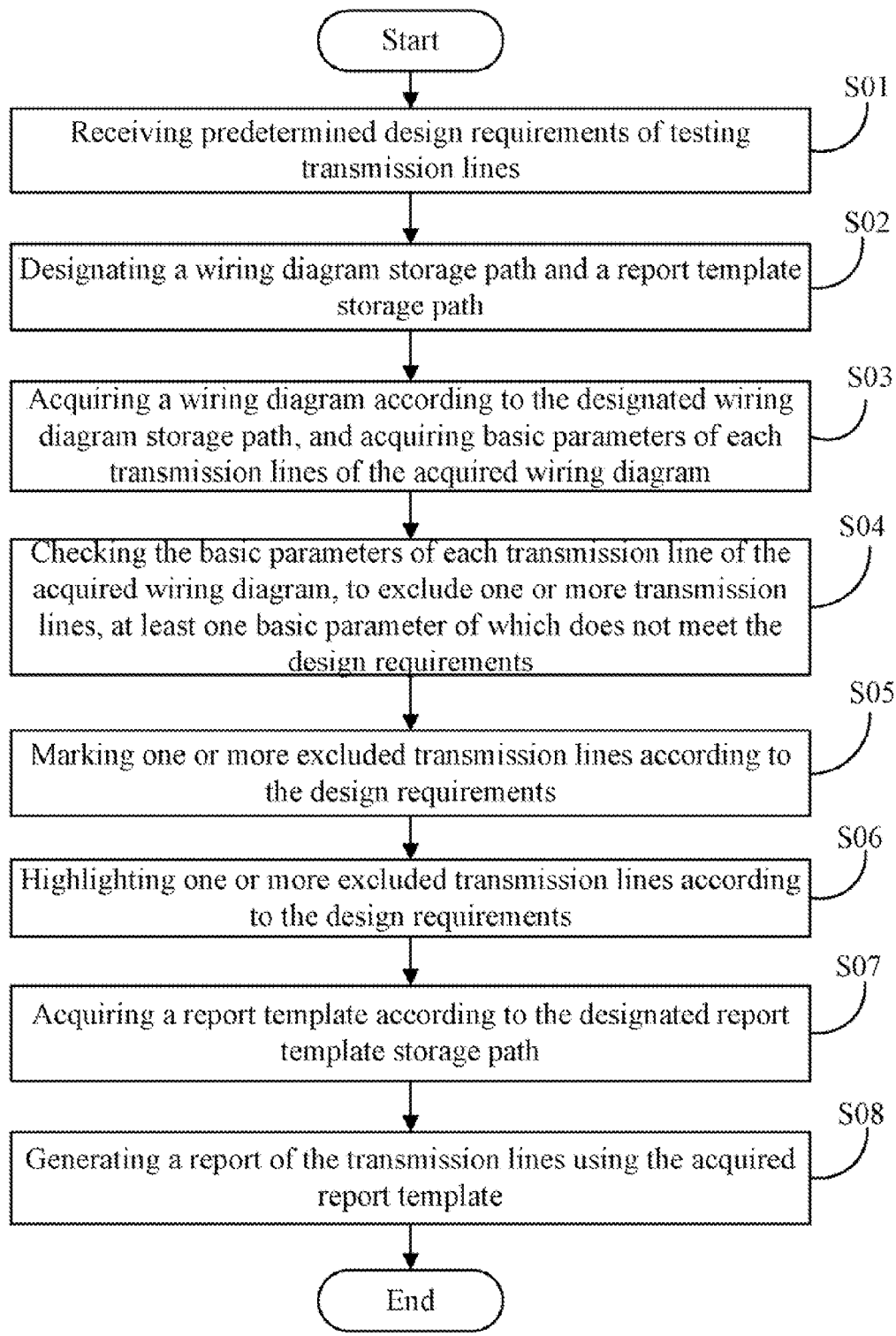
FIG. 3 is a flowchart of one embodiment of a method of automatically testing transmission lines.

FIG. 3 is a flowchart of one embodiment of a method of automatically filtrating transmission lines. Depending on the embodiment, additional steps may be added, others removed, and the ordering of the steps may be changed.

In step S01, the design requirement predetermination module 100 receives determined design requirements of transmission lines. The design requirements include, but are not limited to, an acceptable value or range and an extreme value of each basic parameter of each transmission line, and a degree of importance of each transmission line. As mentioned above, each basic parameter may relate to signal reference parameters, wiring/crosstalk parameters, decoupling parameters, or placement parameters. In one embodiment, the determined design requirements may be input by a user from the input device 14.

In step S02, the storage path designation module 101 designates a wiring diagram storage path and a report template storage path. As mentioned above, the memory 13 stores one or more wiring diagrams and one or more report templates. The memory 13 may include multiple files, one of which stores a first wiring diagram, another one of which stores a second wiring diagram, another one of which stores a first report template, and another one of which stores a second report template, for example. In finding a stored wiring diagram or a report template, the storage path of the wiring diagram or of the report template need to be designated. The storage path may be, for example, D:\wiring diagrams\the first wiring diagram. In one embodiment, the storage path may be inputted by a user from the input device 14.

In step S03, the wiring diagram acquiring module 102 acquires a wiring diagram from the memory 13 according to the designated wiring diagram storage path, and acquires basic parameters of each transmission line of the acquired wiring diagram from the memory 13. As mentioned above, the basic parameters may include signal reference parameters, wiring/crosstalk parameters, decoupling parameters, and placement parameters.

In step S04, the transmission line testing module 103 checks the basic parameters of each transmission line of the acquired wiring diagram, to exclude one or more transmission lines, on the basis that at least one basic parameter does not match or fall within an acceptable value or range.

In step S05, the highlight module 104 marks one or more excluded transmission lines according to the degrees of importance, using a label for example.

In step S06, the highlight module 104 highlights one or more excluded transmission lines, where the extreme value of at least one basic parameter is exceeded, by adding a particular color, for example.

In step S07, the report template acquiring module 105 acquires a report template according to the designated report template storage path, and in step S08, the report generation module 106 generates a report, based on the acquired report template, concerning the mark and the highlighting, and may display the report on the output device 15.

It should be emphasized that the above-described embodiments of the present disclosure, particularly, any embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A method of automatically testing transmission lines, the method being performed by execution of computerized code by a processor of an electronic device, comprising:
receiving predetermined design requirements of transmission lines from an input device of the electronic device, wherein the predetermined design requirements comprises an acceptable value or range of each basic parameter of each transmission line, an extreme value of each basic parameter of each transmission line, and a degree of importance of each transmission line;
designating a wiring diagram storage path and a report template storage path;
acquiring a wiring diagram from a memory of the electronic device according to the designated wiring diagram storage path, and acquiring basic parameters of each transmission line of the acquired wiring diagram from the memory;
checking the basic parameters of each transmission line of the acquired wiring diagram, to exclude one or more transmission lines, at least one basic parameter of which does not meet the predetermined design requirements;
marking one or more excluded transmission lines according to the degrees of importance;
highlighting one or more excluded transmission lines, at least one basic parameter of which exceeds the corresponding extreme value;
acquiring a report template according to the designated report template storage path; and
generating a report of the transmission lines based on the acquired report template, and displaying the report on an output device of the electronic device.

2. The method according to claim 1, wherein the highlighting is carried out by adding a particular color.

3. The method according to claim 1, wherein the basic parameters comprise signal reference parameters, wiring/crosstalk parameters, decoupling parameters, and placement parameters.

4. An electronic device, comprising:
a non-transitory storage medium that stores at least one wiring diagram, basic parameters of each transmission line of the at least one wiring diagram, and at least one report template;
an input device;
an output device;
at least one processor; and
one or more modules that are stored in the non-transitory storage medium; and are executed by the at least one processor, the one or more modules comprising instructions to:
receive predetermined design requirements of transmission lines from the input device, wherein the predetermined design requirements comprises an acceptable value or range of each basic parameter of each transmission line, an extreme value of each basic parameter of each transmission line, and a degree of importance of each transmission line;
designate a wiring diagram storage path and a report template storage path;
acquire a wiring diagram from the non-transitory storage medium according to the designated wiring diagram storage path, and acquire basic parameters of each transmission lines of the acquired wiring diagram from the non-transitory storage medium;
check the basic parameters of each transmission line of the acquired wiring diagram, to exclude one or more transmission lines, at least one basic parameter of which does not meet the design requirements;
mark one or more excluded transmission lines according to the degrees of importance;
highlight one or more excluded transmission lines, at least one basic parameter of which exceeds the corresponding extreme value;
acquire a report template according to the designated report template storage path; and
generate a report of the transmission lines using the acquired report template, and display the report on the output device.

5. The electronic device according to claim 4, wherein the highlight is by adding a particular color.

6. The electronic device according to claim 4, wherein the basic parameters comprise signal reference parameters, wiring/crosstalk parameters, decoupling parameters, and placement parameters.

7. A non-transitory storage medium having stored thereon instructions that, when executed by a processor of an electronic device, causes the processor to:
- receive predetermined design requirements of transmission lines from an input device of the electronic device, wherein the predetermined design requirements comprises an acceptable value or range of each basic parameter of each transmission line, an extreme value of each basic parameter of each transmission line, and a degree of importance of each transmission line;
- designate a wiring diagram storage path and a report template storage path;
- acquire a wiring diagram from a memory of the electronic device according to the designated wiring diagram storage path, and acquire basic parameters of each transmission lines of the acquired wiring diagram from the memory;
- check the basic parameters of each transmission line of the acquired wiring diagram, to exclude one or more transmission lines, at least one basic parameter of which does not meet the design requirements;
- mark one or more excluded transmission lines according to the degrees of importance;
- highlight one or more excluded transmission lines, at least one basic parameter of which exceeds the corresponding extreme value;
- acquire a report template according to the designated report template storage path; and
- generate a report of the transmission lines using the acquired report template; and display the report on an output device of the electronic device.

8. The non-transitory storage medium according to claim 7, wherein the highlight is by adding a particular color.

9. The non-transitory storage medium according to claim 7, wherein the basic parameters comprise signal reference parameters, wiring/crosstalk parameters, decoupling parameters, and placement parameters.

* * * * *